(12) United States Patent
Clara et al.

(10) Patent No.: US 7,576,670 B2
(45) Date of Patent: Aug. 18, 2009

(54) SIGMA-DELTA ANALOG-DIGITAL CONVERTER FOR AN XDSL MULTISTANDARD INPUT STAGE

(75) Inventors: Martin Clara, Villach (AT); Antonio Di Giandomenico, Velden am Woerthersee (AT); Joerg Hauptmann, Wernberg (AT); Andreas Wiesbauer, Poertschach (AT)

(73) Assignee: Infineon Technologies AG, Munich (DE)

( * ) Notice: Subject to any disclaimer, the term of this patent is extended or adjusted under 35 U.S.C. 154(b) by 22 days.

(21) Appl. No.: 11/661,627

(22) PCT Filed: Sep. 2, 2004

(86) PCT No.: PCT/EP2004/009805

§ 371 (c)(1),
(2), (4) Date: Feb. 8, 2008

(87) PCT Pub. No.: WO2006/024317

PCT Pub. Date: Mar. 9, 2006

(65) Prior Publication Data

US 2008/0297385 A1    Dec. 4, 2008

(51) Int. Cl.
*H03M 3/00* (2006.01)
(52) U.S. Cl. .................. 341/143; 341/155
(58) Field of Classification Search ............. 341/143, 341/155
See application file for complete search history.

(56) References Cited

U.S. PATENT DOCUMENTS 6,400,297 B1 * 6/2002 Tucker ................ 341/143
6,954,159 B1 * 10/2005 Cooper et al. ............. 341/143
2004/0036640 A1   2/2004 Kawamura

OTHER PUBLICATIONS

International Search Report and Notification of Transmittal dated Sep. 2, 2004.
Botteron et al., "Design and Switched-Capacitor Implementation of a New Cascade-of-Resonators Σ—Δ Converter Configuration," *IEEE Circuits and Systems*, May 30-Jun. 2, 1999, pp. 45-48.

(Continued)

*Primary Examiner*—Khai M Nguyen
(74) *Attorney, Agent, or Firm*—Jenkins, Wilson, Taylor & Hunt, P.A.

(57) ABSTRACT

The invention relates to a sigma-delta analogue/digital converter for an xDSL multi-standard input stage for converting an xDSL signal into a digital output signal, where the sigma-delta analogue/digital converter (1) has: an analogue loop filter (6) which filters an analogue difference signal between the xDSL signal to be converted and a feedback signal in order to produce a filter output signal; a quantizer which quantizes the filter output signal from the analogue loop filter (6) in order to produce the digital output signal; a first digital/analogue converter (16) which converts the digital output signal into the analogue feedback signal; where the analogue loop filter (6) has at least two resonator filter stages (6a, 6b) which respectively comprise a first integrator (6a-1; 6b-1) and a second integrator (6a-2; 6b-2) connected in series therewith, where the second integrator (6a-2; 6b-2) can be connected to the first integrator (6a-1, 6b-1) by means of a controllable feedback switch (6a-3, 6b-3) in order to close a local feedback loop, where the integrator outputs can respectively be connected by means of a controllable switch (25) to a signal input of an adder (27) which adds the output signals from the integrators in order to produce the filter output signal.

29 Claims, 6 Drawing Sheets

OTHER PUBLICATIONS

Giandomenico et al., "A 15 MHz Bandwidth Sigma-Delta ADC with 11 Bits of Resolution in 0.13 μm CMOS," *European Solid-State Circuits*, Conference in Piscataway, NJ, Sep. 16-18, 2003.

Hamoui et al., "Delta-Sigma Modulator Topologies for High-Speed High-Resolution A/D Converters," *2002 45th Midwest Symposium on Circuits and Systems*, Tulsa, OK, Aug. 4-7, 2002.

* cited by examiner

SIGMA-DELTA ANALOG-DIGITAL CONVERTER FOR AN XDSL MULTISTANDARD INPUT STAGE

The invention relates to a sigma-delta analogue/digital converter for an xDSL multi-standard input stage for converting an analogue xDSL signal into a digital output signal.

In the case of xDSL data transmission, data are transmitted via a telephone subscriber line in the telephone network, particularly via a copper twisted pair. Various xDSL standards are known, such as ADSL (Asymmetrical Digital Subscriber Line), VDSL (Very high bit-rate Digital Subscriber Line), HDSL (High bit-rate Digital Subscriber Line) and SDSL (Symmetric bit-rate Digital Subscriber Line). The xDSL signal is transmitted on the telephone line between a subscriber and the telephone network's exchange as an analogue signal. Both at the subscriber end and at the exchange end, analogue/digital converters respectively convert the received xDSL signal into a digital output signal. The data stream flowing to the subscriber (downstream) and the data stream flowing from the subscriber to the exchange (central office) are transmitted on the data line in various frequency bands. In this case, the bit rate for the data transmission is either symmetrical, as in the case of HDSL, or asymmetrical, as in the case of ADSL, in the upstream direction and the downstream direction. For ADSL, a distinction is drawn between the ADSL plus standard and the simple ADSL system, ADSL plus having a frequency bandwidth of approximately 2.45 MHz, and the frequency bandwidth for a simple ADSL system being 1.38 MHz. For VDSL systems, a distinction is drawn between the conventional VDSL with a quadrature-amplitude-modulated signal, which has a frequency bandwidth of 14.58 MHz, and VDSL2 with a DMT-modulated signal, which has a frequency bandwidth of 18.59 MHz. The frequency bandwidths for transmitting the xDSL signal are very different in the various xDSL standards and are between 1 and 20 MHz.

For the analogue/digital conversion of the received xDSL signal, very different frequency bandwidths have made it impossible to date to provide an analogue/digital converter which is able to convert different xDSL signals into a corresponding digital output signal efficiently. To date, no xDSL input stages have therefore been proposed which are capable of converting analogue xDSL signals from different standards into a corresponding digital output signal. The previous analogue front-end stages based on the prior art contain a specially designed analogue/digital converter for each xDSL standard.

One obvious option for the design of an xDSL multi-standard input stage based on the various analogue/digital converters for converting the various xDSL signals based on the prior art is shown in FIG. 1. In FIG. 1, the xDSL multi-standard input stage receives via a telephone line an analogue input signal which is filtered by an analogue input filter. The filtered xDSL signal is supplied to a switching stage which contains a plurality of controllable switches connected up in parallel. Each controllable switch has an associated analogue/digital converter ADC connected downstream of it which converts the connected analogue xDSL signal into a corresponding digital output signal. The digital output connections of the various analogue/digital converters ADC are combined at an output node and are supplied as a digital output signal to the further data processing. Each of the analogue/digital converters ADC shown in FIG. 1 is provided for converting a particular xDSL signal, for example the analogue/digital converter ADC1 converts an ADSL signal into a digital output signal, the second analogue/digital converter ADC2 converts an ADSL plus signal, an analogue/digital converter ADC3 converts a VDSL signal and a further analogue/digital converter converts a VDSL2 signal.

The switching stage of the xDSL multi-standard input stage shown in FIG. 1 is switched on the basis of a mode selection control signal. The mode selection control signal turns on a respective one of the parallel-connected switches, while the other switches are off. If the xDSL multi-standard input stage receives an ADSL plus signal, for example, then the mode selection control signal turns on the second switch S2 and turns off the other switches.

However, the xDSL multi-standard input stage shown in FIG. 1, which is designed using conventional analogue/digital converters, has the serious drawback that the circuit complexity is very high, since a large number of analogue/digital converters need to be provided, in line with the number of different DSL standards. When such an xDSL multi-standard input stage is integrated on a chip, a very large amount of chip area is therefore required, which means that the production costs are relatively high.

Another drawback is that the high level of circuit complexity means that the xDSL multi-standard input stage draws a very large amount of current and therefore does not operate efficiently in terms of energy. In addition, the xDSL multi-standard input stage shown in FIG. 1 generates a large amount of heat which sometimes needs to be dissipated with a great deal of complexity using heat sinks.

Another drawback of the xDSL multi-standard input stage of conventional design shown in FIG. 1 is that it cannot be used flexibly for new xDSL standards. The xDSL multi-standard input stage of conventional design shown in FIG. 1 cannot be programmed for arbitrary xDSL standards.

It is therefore the object of the present invention to provide an analogue/digital converter which is suitable for different xDSL standards and at the same time requires little circuit complexity.

The invention achieves this object by means of a sigma-delta analogue/digital converter having the features specified in patent claim 1.

The invention provides a sigma-delta analogue/digital converter for an xDSL multi-standard input stage for converting an analogue xDSL signal into a digital output signal, where the sigma-delta analogue/digital converter has: an analogue loop filter which filters an analogue difference signal between the xDSL signal to be converted and a feedback signal in order to produce a filter output signal;

a quantizer which quantizes the filter output signal from the analogue loop filter in order to produce the digital output signal;

a digital/analogue converter which converts the digital output signal into the analogue feedback signal;

where the analogue loop filter has at least two resonator filter stages which respectively comprise a first integrator and a second integrator connected in series therewith, where the second integrator can be connected to the first integrator by means of a controllable feedback switch in order to close a local feedback loop, and where the integrator outputs can respectively be connected by means of a controllable switch to a signal input of an adder which adds the output signals from the integrators in order to produce the filter output signal.

One advantage of the inventive sigma-delta analogue/digital converter is that the circuit complexity is very low, which means that only very little area is required on the chip for integrating the signal-delta analogue/digital converter based on the invention.

Another advantage of the inventive sigma-delta analogue/digital converter is that the energy consumption is likewise very low on account of the small number of circuit components required.

Another advantage of the inventive sigma-delta analogue/digital converter based on the invention is that it is programmable and can therefore be used flexibly for known or novel xDSL standards.

In one preferred embodiment of the inventive sigma-delta analogue/digital converter, the feedback switch has a respective signal amplifier with adjustable gain connected up in series with it which weights the respective feedback signal from the closed local feedback loop.

In one preferred embodiment, the controllable switches provided at the outputs of the integrators have respective signal amplifiers with adjustable gain connected up in series with them which weight the output signal from the respective integrator.

The signal amplifiers are preferably voltage-controlled current sources.

In one preferred embodiment, the integrators have a respective operational amplifier whose output is fed back to its input via a capacitor.

In this context, the capacitance of the capacitor is preferably adjustable.

In one preferred embodiment of the inventive sigma-delta analogue/digital converter, the power supply for the operational amplifiers can respectively be disconnected by a controllable switch.

The operational amplifiers are preferably of fully differential design.

In one preferred embodiment, the output side of the quantizer is connected to the first digital/analogue converter via a first signal delay circuit.

In one preferred embodiment, the output side of the quantizer can additionally be connected to a second digital/analogue converter by means of a controllable switch, said second digital/analogue converter converting the digital output signal into a second analogue feedback signal which is subtracted from the filter output signal from the analogue loop filter by means of a subtractor.

In one preferred embodiment, the second digital/analogue converter has a signal amplifier with adjustable gain connected upstream of it.

In one preferred embodiment, the signal amplifier has a second signal delay circuit provided in series with it.

In one preferred embodiment, the quantizer has a digital decimation filter connected downstream of it.

Preferably, the controllable switches respectively have a control line, and these are connected to a programmable configuration memory.

In one preferred embodiment, the signal gain of a signal amplifier can respectively be set via a control line which is connected to the configuration memory.

In one preferred embodiment of the inventive sigma-delta analogue/digital converter, for the purpose of setting the sigma-delta analogue/digital converter to different xDSL standards, the configuration memory stores a respective programmable configuration set for each xDSL standard.

Each configuration set comprises a multiplicity of coefficients which are stored in digital form in the configuration memory.

In one preferred embodiment, a configuration set is read from the configuration memory on the basis of a standard selection control signal in order to control the controllable switches and in order to set the signal amplifiers.

In one preferred embodiment, the capacitances of the integrators provided in the analogue loop filter can be set on the basis of configuration coefficients from the configuration set which has been read.

In one preferred embodiment, the signal delays from the two signal delay circuits can be set on the basis of configuration coefficients from the configuration set which has been read.

In one particularly preferred embodiment of the inventive sigma-delta analogue/digital converter, the analogue loop filter has two resonator filter stages.

Preferably, a subtractor is also provided which subtracts the feedback signal from the xDSL signal received on the input side in order to produce the difference signal.

The xDSL signal is preferably received via a telephone line.

In one preferred embodiment of the inventive sigma-delta analogue/digital converter, the quantizer, the two digital/analogue converters and the decimation filter are clocked with the same clock signal.

In this case, the clock signal is preferably produced by an integrated clock signal generator.

The quantizer preferably comprises a plurality of comparators connected up in parallel.

The digital/analogue converters can preferably be activated by means of external control signals which are produced on the basis of stored configuration coefficients.

The digital/analogue converters are preferably current-controlled digital/analogue converters of fully differential design.

In one preferred embodiment, the inventive sigma-delta analogue/digital converter is integrated on a chip.

In one preferred embodiment, the sigma-delta analogue/digital converter has an analogue input filter connected upstream of it.

The text below describes preferred embodiments of the inventive sigma-delta analogue/digital converter with reference to the appended figures in order to explain features which are fundamental to the invention.

Figure 1:
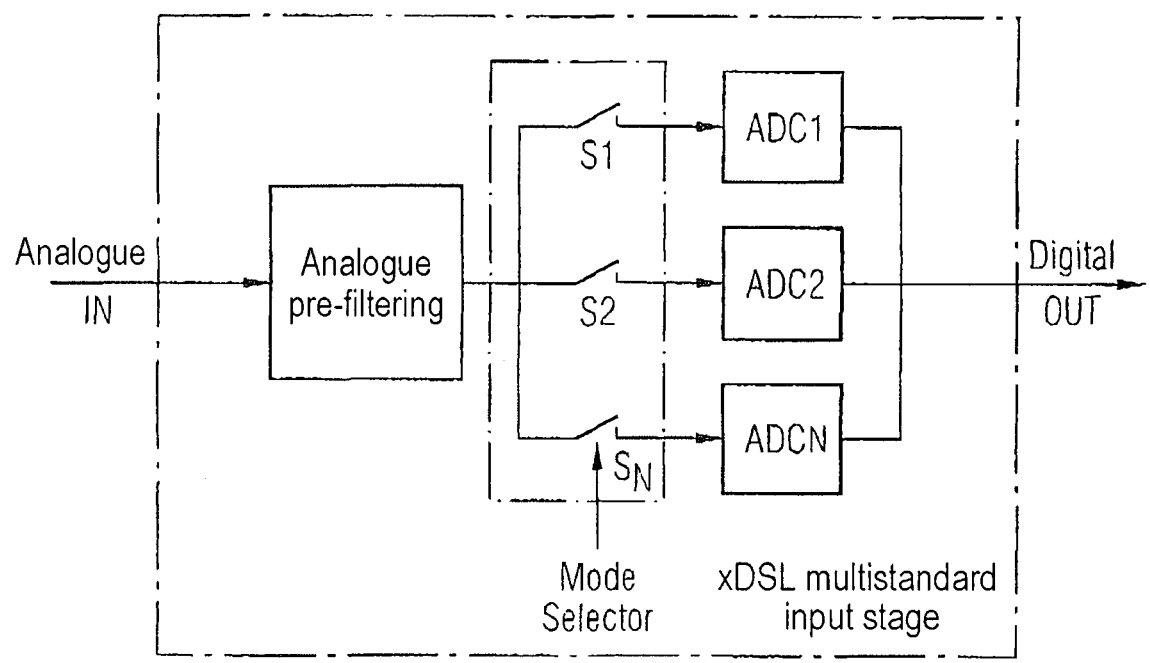
FIG. 1 shows an xDSL multi-standard input stage of conventional design.
Figure 2:
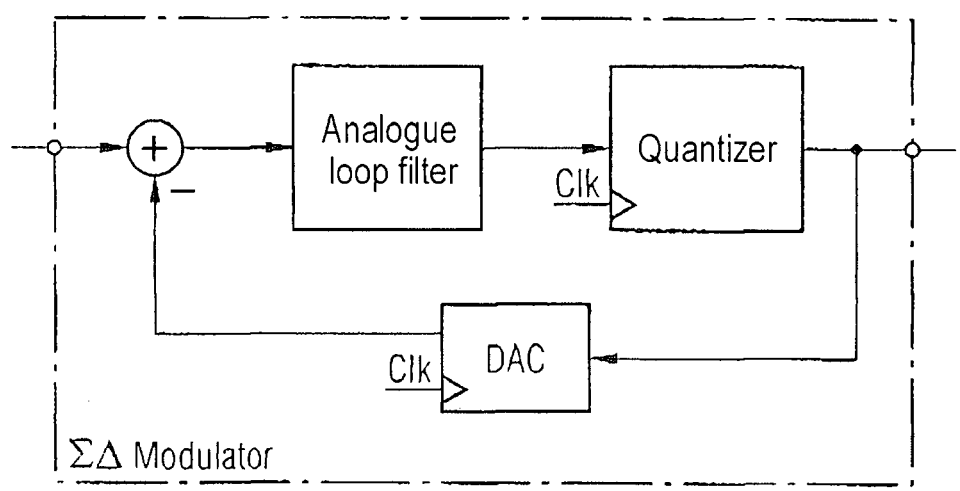
FIG. 2 shows the circuit design of a sigma-delta analogue/digital converter based on the prior art.

The analogue/digital converter used for the xDSL multi-standard input stage based on the invention is designed as a sigma-delta analogue/digital converter. FIG. 2 shows the circuit design for a conventional sigma-delta analogue/digital converter based on the prior art. The sigma-delta analogue/digital converter comprises two main parts, namely a delta-sigma modulator and a digital filter. First of all, a low-resolution analogue/digital conversion is carried out. Next, the quantization noise is greatly reduced by means of digital filtering. The sigma-delta modulator has a feedback loop which comprises a subtractor, an integrator, a coarse quantizer or comparator and a digital/analogue converter in the feedback path. The quantizer comprises a low-resolution but high sampling-rate analogue digital converter which delivers a digital output signal. The digital/analogue converter provided in the feedback path takes the digital output signal and produces a quantized analogue signal or approximation signal which is subtracted from the analogue input signal by the subtractor. By way of example, the analogue loop filter is formed by an integrator. In the feedback signal, the approximation signal is compared with the analogue input signal, and the difference is integrated and supplied to the quantizer. The control loop tracks the arithmetic mean value of the approximation voltage to the mean value of the input voltage.

Subsequent digital low-pass filtering converts the modulator output signal into high-resolution parallel data words which have a substantially low sampling rate. The energy in the quantization noise is distributed evenly over a broad frequency band by the oversampling.

Sigma-delta modulators have the advantage that they require less current than conventional analogue/digital converters, so that they are particularly suitable for portable receivers. Added to this are the simplicity and robustness of the analogue components used.

Figure 3:
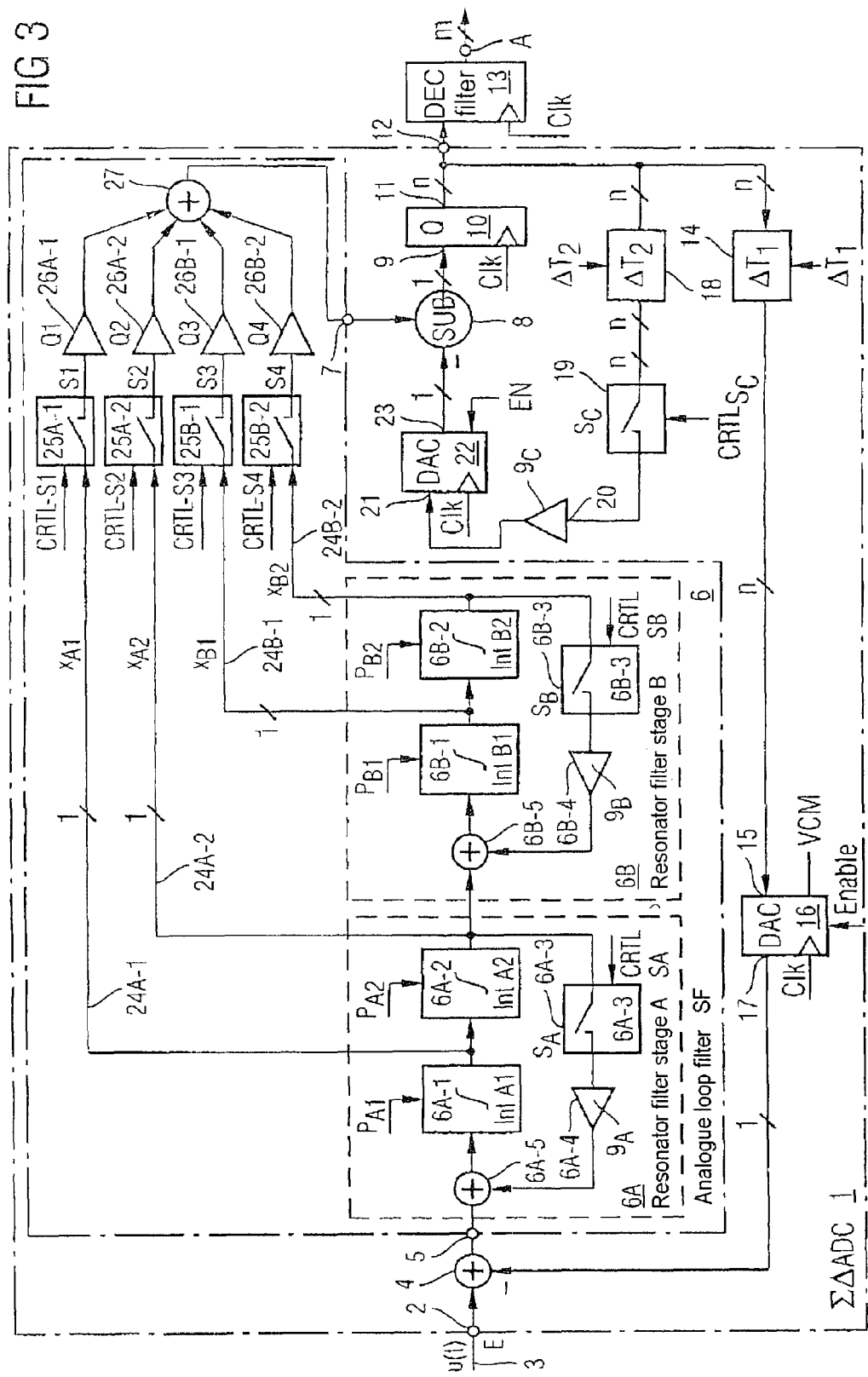
FIG. 3 shows a preferred embodiment of the inventive sigma-delta analogue/digital converter.

FIG. 3 shows a preferred embodiment of the inventive sigma-delta analogue/digital converter 1 based on the invention.

The sigma-delta analogue/digital converter 1 has an analogue signal input 2 for receiving an analogue xDSL signal based on any standard via a telephone subscriber line 3. The analogue xDSL signal to be converted is supplied to a subtractor 4 which subtracts a feedback signal from the applied xDSL signal in order to produce a difference signal. The difference signal produced is supplied to a signal input 5 of an analogue loop filter 6. The analogue loop filter 6 filters the applied difference signal in order to produce a filter output signal, which is present at an output 7 of the analogue loop filter 6. The output signal from the analogue loop filter 6 is supplied to a second subtractor 8 which subtracts a feedback signal and applies the difference signal produced to an input 9 of a quantizer 10. The quantizer 10 quantizes the input signal applied to the input 9 in order to produce the digital output signal. The digital output signal is output by an output 11 of the quantizer 10 to an output 12 of the inventive sigma-delta analogue/digital converter 1, the output 12 preferably having a digital decimation filter 13 connected downstream of it. The digital output signal produced has a bit length n and is applied as a digital feedback signal to a signal input 15 of a first digital/analogue converter 16 via a first signal delay circuit 14. The digital/analogue converter 16 converts the digital output signal which has been fed back into the analogue feedback signal for the first subtractor 4 and outputs it to the subtractor 4 via an output 17 and a line. Besides the first or outer feedback loop formed by the signal delay circuit 14 and the first digital/analogue converter 16, the inventive sigma-delta analogue/digital converter 1 has a second or inner feedback loop in one preferred embodiment. The second feedback loop comprises a further signal delay circuit 18 which delays the digital output signal with an adjustable time delay and outputs it to an input 21 of a second digital/analogue converter 22 via a controllable switch 19 and a signal amplifier 20. The second digital/analogue converter 22 converts the applied digital output signal fed back via the inner feedback loop into a second analogue feedback signal which is output to the second subtractor 8 via an output 23 of the second digital/analogue converter 22. Whereas the outer feedback loop of the inventive sigma-delta analogue/digital converter is constantly closed, the inner feedback loop can be completed and broken by means of the controllable switch 19. The signal delay $\Delta t1$ or $\Delta t2$ of the two signal delay circuits 17, 18 is preferably adjustable via internal control lines. The two digital/analogue converters 16, 22 can be activated, or deactivated, via control lines (Enable). Both digital/analogue converters 16, 22 are clocked with the same clock signal CLK, which is preferably generated by an integrated clock signal generator 30. In addition, the clock signal CLK clocks the quantizer 10, which is preferably designed using comparators connected in parallel. The gain $G_C$ of the signal amplifier 20 within the inner feedback loop is likewise preferably adjustable.

In the embodiment shown in FIG. 3, the analogue loop filter 6 has two resonator filter stages 6a, 6b. In other embodiments, further cascaded resonator filter stages 6c, 6d . . . can be provided.

Each resonator filter stage 6a, 6b has two respective integrators connected in series. In the embodiment shown in FIG. 3, the resonator filter stage A contains a first integrator 6a-1 and a second integrator 6a-2 connected in series therewith. In the same way, the resonator filter stage 6b contains a first integrator 6b-1 and a second integrator 6b-2. The two integrators can respectively be switched by means of a controllable feedback switch 6a-3, 6b-3 in order to close a local feedback loop. The feedback switches 6a-3, 6b-3 are provided in a feedback path of the resonator filter stages 6a, 6b and are actuated by an internal control signal CRTL-A or CRTL-B in order to close the local feedback loop. The output side of the controllable switches 6a-3, 6b-3 is connected via signal amplifiers 6a-4, 6b-4 to an adder 6a-5, 6b-5 which respectively adds the output signal from the preceding resonator filter stage to the signal fed back from the resonator filter stage and supplies it to the first integrator 6a-1 or 6b-1. The signal amplifiers 6a-4, 6b-4 in the feedback circuit preferably have an adjustable gain. The signal amplifiers 6a-4, 6b-4 are formed by voltage-controlled current sources, for example. The integrators within the resonator stages 6a, 6b are preferably formed by operational amplifiers whose signal output is fed back via a capacitor to its signal input. The capacitance of the feedback capacitor is preferably adjustable. In addition, the power supply for the operational amplifiers within the integrators can preferably be disconnected via a controllable switch on the basis of a control signal (Power up, Power down). In one preferred embodiment, the operational amplifiers and integrators are of fully differential design. The controllable switches 6a-3, 6b-3 within the resonator filter stages A, B are preferably formed by transistors, particularly by field effect transistors, whose gate connections can be actuated or configured via control lines.

The integrators 6a-1, 6a-2, 6b-1, 6b-2 have signal outputs which can be connected to an input of an associated signal amplifier 26a-1, 26a-2, 26b-1, 26b-2 in a forward signal path of the analogue loop filter 6 via lines 24a-1, 24a-2, 24b-1, 24b-2 by means of a controllable switch 25a-1, 25a-2, 25b-1, 25b-2. The signal amplifiers 26 are likewise preferably formed by controllable current sources whose signal gain can be set via a setting line. The output side of the signal amplifiers 26 is connected to inputs of an adder 27 which adds the output signals from the integrators in order to produce the filter output signal from the analogue loop filter 6. The filter output signal produced by the adder 27 is output via the signal output 7 of the loop filter 6 to the subtractor 8, which subtracts from it the feedback signal which has been fed back via the inner feedback loop. This feedback signal is zero if the switch 19 is open. Preferably, the sigma-delta analogue/digital converter 1, as shown in FIG. 3, is integrated on a chip.

By switching the switches 6a-3, 6b-3, it is possible to close the feedback loop of the resonator filter stages 6a, 6b. The Power up/Power down signals allow the integrators provided in the resonator filter stages 6a, 6b to be activated and deactivated.

The transfer function for the analogue loop filter is as follows:

$$SF(f) = \frac{a_4 \cdot s^4 \cdot a_3 s^3 + a_2 \cdot s^2 + a_1 + a_0}{[(T_s \cdot s)^2 + b_1][(T_s \cdot s)^2 + b_2]} \quad (1)$$

where $T_S$ is the time delay in a first signal delay circuit 14 and the coefficients $a_0$-$a_4$ are determined by the signal gain of the amplifiers 26 in the forward signal path of the analogue loop filter 6.

The transfer frequency of the analogue loop filter 6 is that frequency at which the open-loop gain of the analogue loop filter 6 is unity.

The stability condition which is to be met is as follows:

$$F_{CLK} > f_{transfer} \quad (2)$$

where $f_{CLK}$ is the clock frequency of the clock signal CLK and $f_{transfer}$ is the transfer frequency of the analogue loop filter 6.

The bit resolution m at the output of the decimation filter 13 is obtained from the bit resolution of the quantizer 10 and the logarithm base two of the open-loop loop gain at the maximum frequency of the analogue input signal u(t) which is to be converted.

The bit resolution of the quantizer 10 is preferably 4 bits. In one preferred embodiment, the bit resolution at the output of the decimation filter 13 is 14 bits.

By setting the filter order of the analogue loop filter 6 using the Power up/Power down signals and by setting the oversampling rate (OSR: Oversampling Ratio) and the clock rate, it is possible to reduce the dynamic operating range (DR: Dynamic Range) counter to an increase in the frequency bandwidth of the input signal, or the dynamic range DR can be increased for a reduction in the frequency bandwidth of the analogue input signal which is to be converted, in order to satisfy various DSL transmission standards for wire-based data transmission.

For the oversampling rate, the following is true:

$$OSR > \frac{f_{CLK}}{2\text{nd analogue frequency bandwidth}} \quad (3)$$

The sigma-delta analogue/digital converter 1 shown in FIG. 3 shifts the quantization noise produced from a low frequency range to a high frequency range (what is known as noise shaping). The downstream decimation filter 13 is a low-pass filter which filters out the shifted, high-frequency interfering noise components.

The sigma-delta analogue/digital converter shown in FIG. 3 is suitable for use both at the subscriber end and at the office end or exchange end.

The inventive sigma-delta analogue/digital converter 1 shown in FIG. 3 can be changed over between various modes of operation by means of the controllable switches. The table below shows the various switch positions for various xDSL standards.

As can be gleaned from Table 1, all the switches are closed in order to set the VDSL standard, for example.

To set an ADSL standard, the switch 25b-2 is opened, so that the output signal from the integrator S6b-2 within the analogue loop filter 6 does not reach the adder 27. In addition, the integrator 6b-2 is deactivated by a Powerdown control signal PB2. In this way, the filter order of the analogue loop filter 6 is reduced from a filter order 4 to a filter order 3. Furthermore, opening the switch S6B-6-3 opens the local feedback loop within the resonator filter stage 6b. In the VDSL modes of operation, the switch S19 is open, whereas the switch S19 is closed in the ADSL modes of operation.

The inventive sigma-delta analogue/digital converter 1, as is shown in FIG. 3, is suitable both for an xDSL multi-standard input stage at the subscriber end and for an xDSL multi-standard input stage at the office end. As can be gleaned from Table 1, the use of the sigma-delta analogue/digital converter 1 in ADSL mode at the office end (central office) involves the switch S25B-1 and the switch S6A-3 being opened in comparison with an ADSL mode at the subscriber end, for example. Furthermore, the first integrator in the second resonator filter stage B is additionally deactivated by a Pulldown Signal PB1. In this mode of operation, the sigma-delta analogue/digital converter 1 therefore has only the activated resonator filter stage 6a, whose local feedback loop is open, however, i.e. the analogue loop filter comprises two series-connected integrators 6a-1, 6a-2 without local feedback in this mode of operation.

The different ADSL modes of operation, i.e. ADSL+ or normal ADSL, and the different VDSL modes of operation, i.e. VDSL2 and normal VDSL, are set by means of the signal gain coefficients of the signal amplifiers 6a-4, 6b-4 in the local feedback paths and by means of the signal amplifiers 26 in the forward paths of the analogue loop filter 6. In this case, the signal gain of the signal amplifiers is preferably set via a respective control line which is connected to a configuration memory 28.

Figure 4:
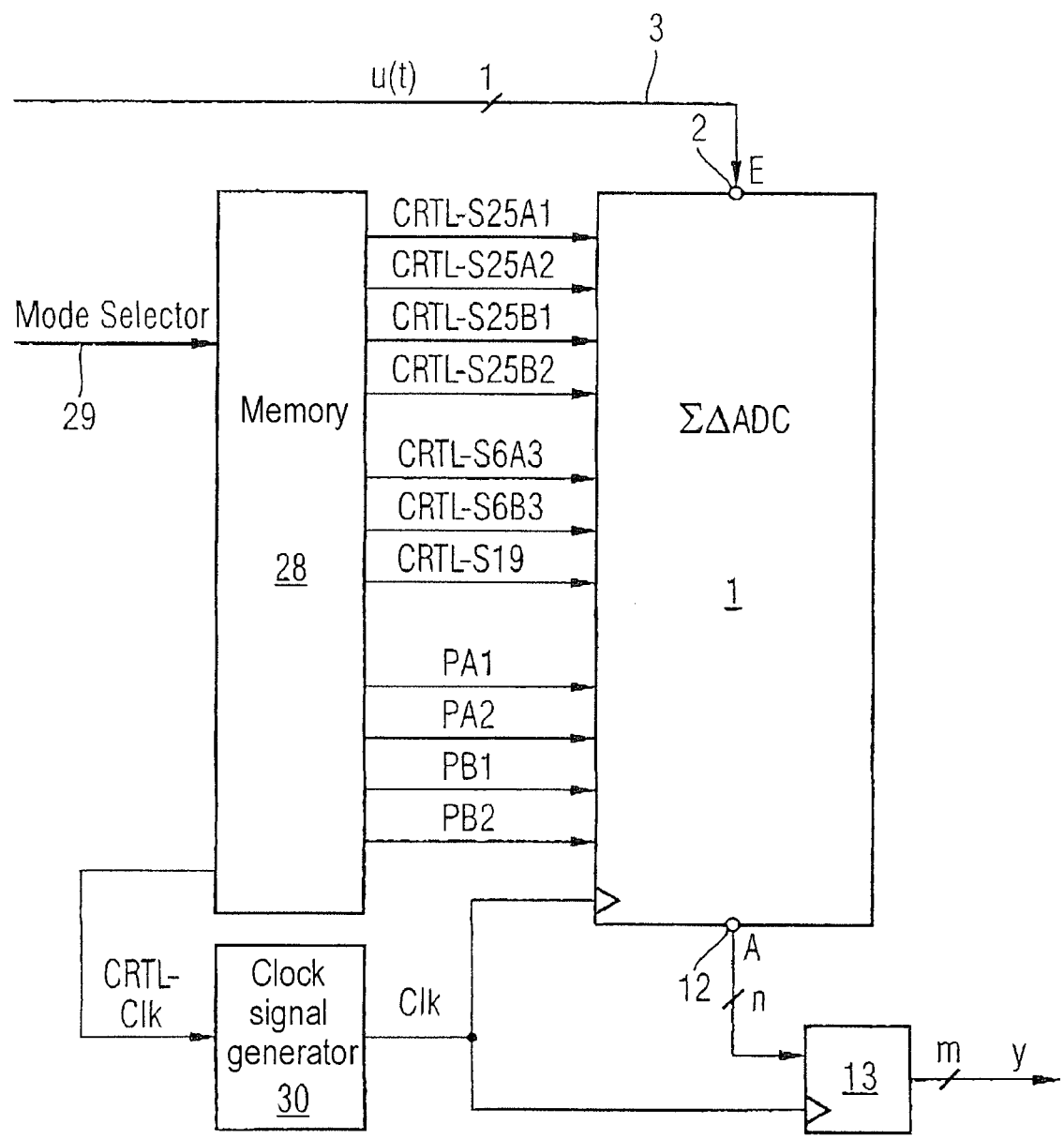
FIG. 4 shows an expanded embodiment of the inventive sigma-delta analogue/digital converter.

FIG. 4 shows the whole arrangement with the inventive sigma-delta analogue/digital converter 1, which is connected to the configuration memory 28 via control lines. FIG. 4 shows the control lines for actuating the controllable switches within the sigma-delta analogue/digital converter 1 and the control lines for activating and deactivating the four integrators within the two resonator filter stages 6a, 6b.

In addition, control lines (not shown) can preferably be used to set the signal gains of the signal amplifiers 6a-4, 6b-4, 26A-1, 26A-2, 26B-1, 26B-2 and of the signal amplifier 20 in line with stored signal gain coefficients within the memory 28.

In addition, in one preferred embodiment, the activation control signals (Enable) for the two digital/analogue converters 16, 22 and the signal delayed times $\Delta t1$, $\Delta t2$ for the two signal delay circuits 14, 18 can be set in line with stored coefficients.

TABLE 1

| Mode | S25A-1 | S25A-2 | S25B-1 | S25B-2 | SGA-3 | SGB-3 | S19 | $P_{A1}$ | $P_{A2}$ | $P_{B1}$ | $P_{B2}$ |
|---|---|---|---|---|---|---|---|---|---|---|---|
| VDSL (QAM) | 1 | 1 | 1 | 1 | 1 | 1 | 1 | 1 | 1 | 1 | 1 |
| VDSL2 (DMT) | 1 | 1 | 1 | 1 | 1 | 1 | 1 | 1 | 1 | 1 | 1 |
| ADSL+ | 1 | 1 | 1 | Ø | 1 | Ø | Ø | 1 | 1 | 1 | Ø |
| ADSL | 1 | 1 | 1 | Ø | 1 | Ø | Ø | 1 | 1 | 1 | Ø |
| ADSL CO Central Office | 1 | 1 | Ø | Ø | Ø | Ø | Ø | 1 | 1 | Ø | Ø |

The coefficient memory 28 contains a number of coefficient sets, each coefficient set comprising the setting coefficients for an associated xDSL standard. Via an external control line 29, the coefficient memory 28 receives a mode selection control signal which selects the desired coefficient set. The stored coefficients in the selected coefficient set are taken as a basis for applying the control signals to the controllable switches and to the signal amplifiers within the sigma-delta analogue/digital converter 1. In addition, the stored coefficients are additionally taken as a basis for activating and deactivating the two digital/analogue converters 16, 22 and for setting the signal delay times for further signal delay circuits 14, 18.

An integrated clock signal generator 30 generates the clock signal for the sigma-delta analogue/digital converter 1 based on the invention and for the downstream decimation filter 13. In one preferred embodiment, the configuration memory 28, the clock signal generator 30, the sigma-delta analogue/digital converter 1 and the downstream decimation filter 13 are integrated on a chip.

One advantage of the inventive arrangement shown in FIG. 4 is that the coefficient memory 28 is easily programmable. In addition, the amount of current drawn is small, since only the necessary components are activated for the respective xDSL standard and the other components can be disconnected. On account of the small number of necessary components, particularly on account of the small number of necessary components within the analogue loop filter 6, the space requirement for the inventive sigma-delta analogue/digital converter 1 when being integrated on a chip is minimal. The signal gain of the sigma-delta analogue/digital converter 1 shown in FIG. 3 can be programmed inherently by means of the setting of the signal gain coefficient.

In one preferred embodiment, the selected coefficient set is also taken as a basis for setting the clock frequency produced by the clock signal generator 30. In one preferred embodiment, the clock frequency $F_{CLK}$ produced by the clock signal generator 30 is altered by a frequency divider for altering the sample rate.

Table 2 shows the programmability of the inventive sigma-delta analogue/digital converter 1 in a preferred embodiment for five different xDSL standards. The clock frequency of the clock signal, the oversampling rate (OSR) and the filter order are set in line with the coefficient set which has been read. The resultant bandwidth (BW) and the resultant dynamic range DR can likewise be gleaned from Table 2. In the case of a vDSL mode of operation, the analogue loop filter 6 has a filter order of four, i.e. all four integrators in the resonator filter stages A, B have been activated. By contrast, in the case of an ADSL mode of operation, the second integrator in the resonator filter stage has been deactivated, so that the filter order of the loop filter 6 is three. In the case of an ADSL mode at the office end, both integrators in a resonator filter stage 6b have been deactivated, which means that the filter order of the analogue loop filter 6 is just two in this mode. It can be seen that the higher the signal bandwidth BW the smaller the dynamic range DR of the inventive sigma-delta analogue/digital converter 1.

TABLE 2

| Mode | Fclk(MHz) | PSR | BW [MHz] | Filter order | DR |
|---|---|---|---|---|---|
| VDSL (QAM) | 349.92 | 12 | 14.580 | 4th | 12 |

TABLE 2-continued

| Mode | Fclk(MHz) | PSR | BW [MHz] | Filter order | DR |
|---|---|---|---|---|---|
| VDSL2 (DMT) | 353.28 | 9.5 | 18.594 | 4th | 11 |
| ADSL | 176.64 | 36 | 2.453 | 3rd | 13 |
| ADSL | 176.64 | 64 | 1.380 | 3rd | 13.5 |
| ADSL CO | 105.984 | 64 | 0.828 | 2nd | 14 |

Figure 5:
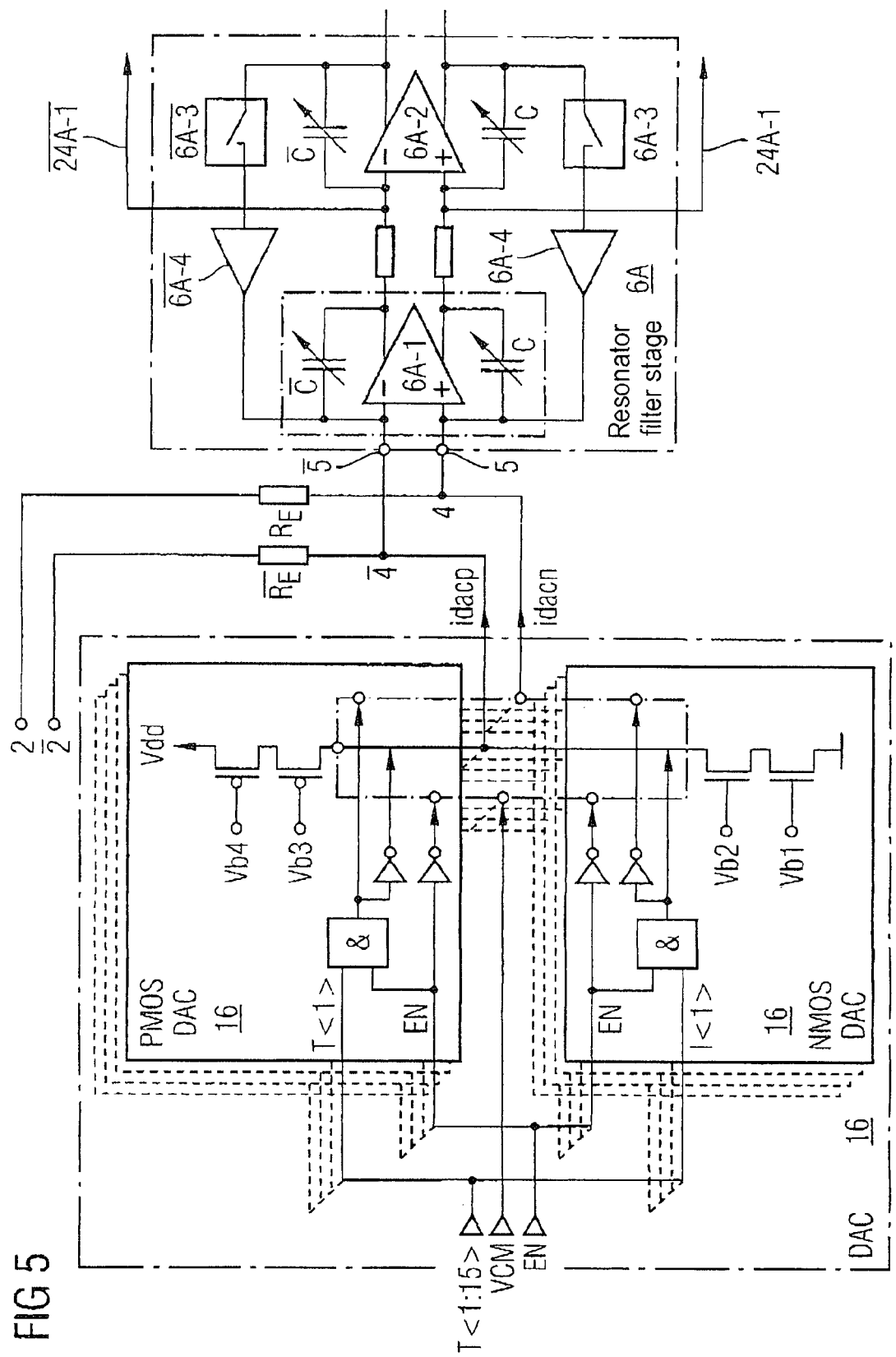
FIG. 5 shows a preferred embodiment of the first digital/analogue converter used in the feedback path and of a first resonator filter stage of the analogue loop filter, the output of said filter stage being connected to said digital/analogue converter.

FIG. 5 shows a preferred embodiment of the first digital/analogue converter in the first feedback loop, the output side of said digital/analogue converter being connected to the first resonator filter stage 6a of the inventive analogue loop filter 6. The embodiment shown in FIG. 5 shows a sigma-delta analogue/digital converter of fully differential design based on the invention.

The integrators within the resonator filter stage are designed using operational amplifiers of fully differential design whose signal output is coupled to the input via a feedback capacitor C. In one preferred embodiment, the capacitance of the feedback capacitor C is adjustable. The setting is made preferably by coefficients which are stored in the coefficient memory 28.

The digital/analogue converter 16 is also of fully differential design, and the digital/analogue converter is a current-controlled digital/analogue converter of fully differential design. The use of a Return-to-Zero (RZ) feedback pulse attenuates the jitter sensitivity and the pulse distortion. The RZ feedback is achieved by connecting the outputs of the current mirrors in the DAC to a common mode (VCM) for a short period. The digital/analogue converter 16 is activated and deactivated by an Enable control signal (EN).

Figure 6:
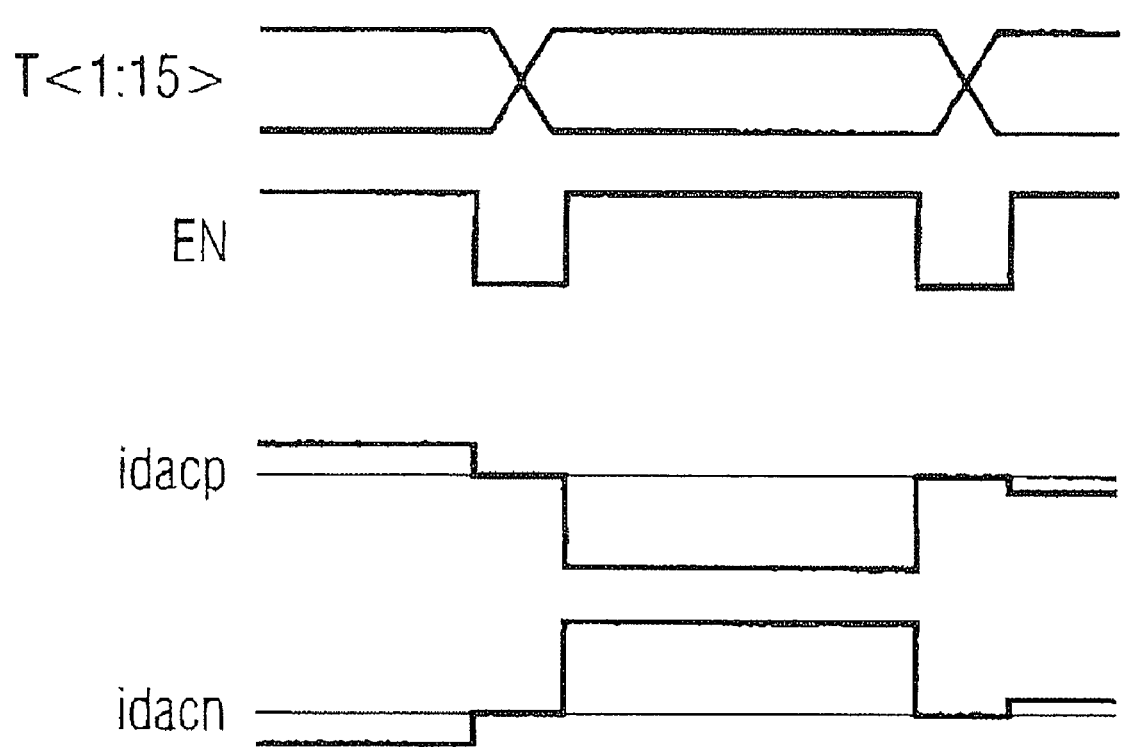
FIG. 6 shows a timing diagram to explain the operation of the digital/analogue converter shown in FIG. 5.

FIG. 6 shows signal flows to explain the manner of operation of the digital/analogue converter 16 shown in FIG. 5.

Figure 7:
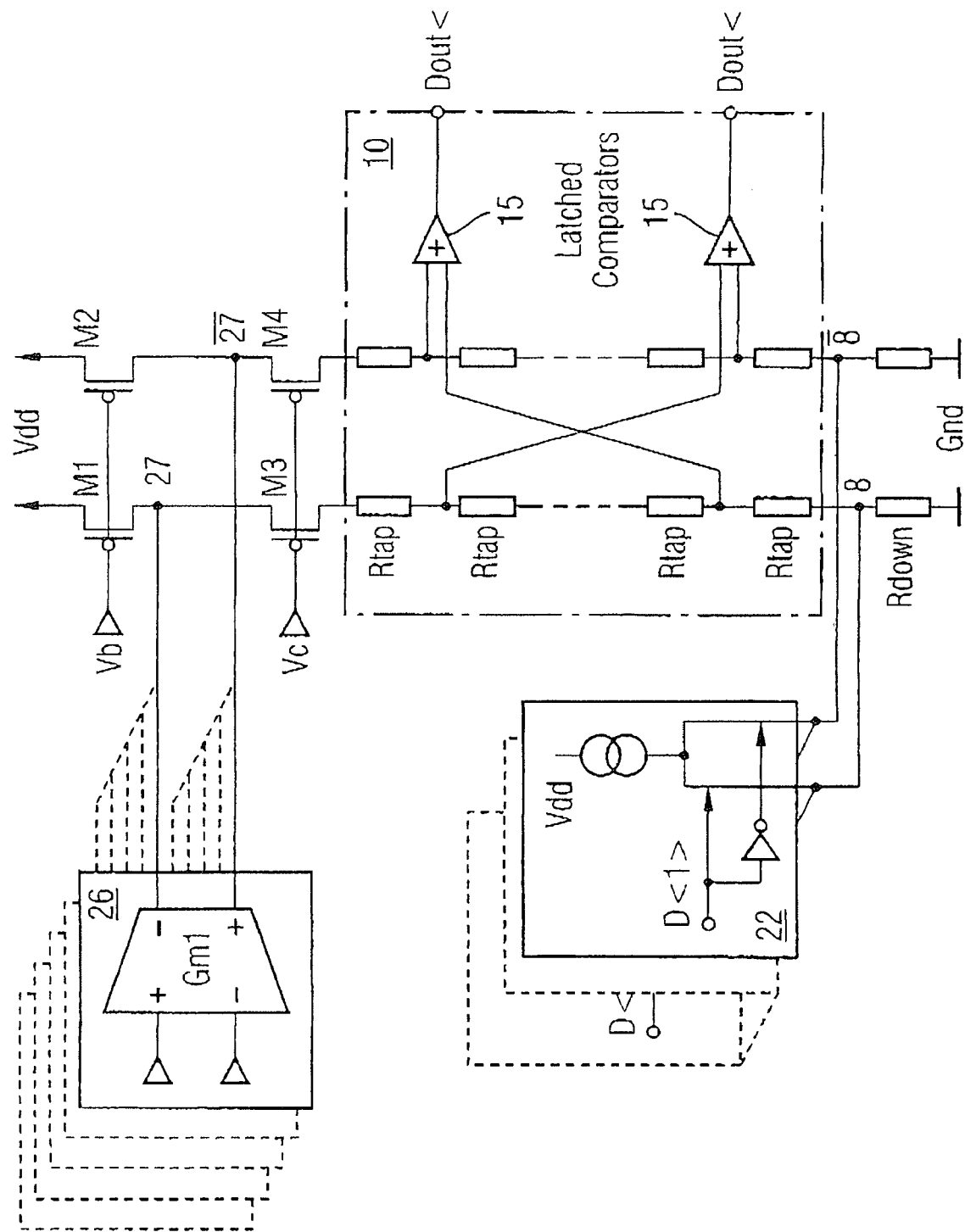
FIG. 7 shows a circuit implementation for the adder, for the second digital/analogue converter and for the quantizer in a preferred embodiment of the inventive sigma-delta analogue/digital converter.

FIG. 7 shows a preferred embodiment of the addition stage 27, of the second digital/analogue converter 22 and of the quantizer 10 based on the invention. The forward coefficients or signal gain coefficients are implemented by using a differential pair of transconductors. The output currents from the transconductors are summed on the source connections of the MOSFET transistors M1 and M2, whose voltage is kept constant by the cascode circuit, which comprises the MOSFET transistors M3, M4. This increases the linearity of the transconductor cells. The resultant summed current then flows through a resistor line connecting fifteen taps. The taps are connected to comparators within the quantizer 10, which preferably contains fifteen comparators, in order to form a 4-bit flash analogue/digital converter.

In the example shown in FIG. 7, the signal gain of the quantizer 10 is $$Gain_{20} = \frac{15 R_{tap} I_{dc}}{Gm(R_{down} + 7 \cdot R_{tap}) V_{FS}} \quad (4)$$

where $G_m$ is the transconductance of a transconductance cell,
$V_{FS}$ is the full-scale voltage,
$R_{tap}$ is the resistance of the resistor element within the resistor line and
$I_{dc}$ is the current flowing through the MOSFET transistor 2.

The second digital/analogue converter 22 is implemented by a unipolar-current-controlled DAC of fully differential design with Non-Return-to-Zero encoding.

In one preferred embodiment of the inventive sigma-delta analogue/digital converter 1, it is integrated on the chip using 0.13-μm CMOS technology. The signal bandwidth is up to 20 MHz. The inventive sigma-delta analogue/digital converter is distinguished by very high resolution with a simultaneously high conversion rate. The sigma-delta analogue/digital converter is operated at a clock frequency of over 300 MHz. The inventive sigma-delta analogue/digital converter 1 operates at a supply voltage of 1.5 volts, for example. In this case, the power consumption is below 70 mW.

LIST OF REFERENCE SYMBOLS

1 Sigma-delta analogue/digital converter
2 Signal input
3 Signal line
4 Subtractor
5 Filter input
6 Analogue loop filter
7 Filter output
8 Subtractor
9 Quantizer input
10 Quantizer
11 Quantizer output
12 Output
13 Decimation filter
14 Signal delay switch
15 Converter input
16 Digital/analogue converter
17 Converter output
18 Signal delay circuit
19 Switch
20 Signal amplifier
21 Converter input
22 Digital/analogue converter
23 Converter output
24 Lines
25 Switch
26 Signal amplifier
27 Adder
28 Configuration memory
29 Control line
30 Clock signal generator

The invention claimed is:

1. A sigma delta analog/digital converter for an xDSL multi standard input stage for converting an xDSL signal into a digital output signal, wherein the sigma delta analog/digital converter (1) comprises:
(a) an analog loop filter (6) which filters an analog difference signal between the xDSL signal to be converted and a feedback signal in order to produce a filter output signal;
(b) a quantizer which quantizes the filter output signal from the analog loop filter (6) in order to produce the digital output signal; and
(c) a first digital/analog converter (16) which converts the digital output signal into the analog feedback signal, and further wherein the analog loop filter (6)
has at least two resonator filter stages (6a, 6b) which respectively comprises a first integrator (6a 1; 6b 1) and a second integrator (6a 2; 6b 2) connected in series thereto,
wherein the second integrator (6a 2; 6b 2) can be connected to the first integrator (6a 1, 6b 1) by means of a controllable feedback switch (6a 3, 6b 3) adapted to close a local feedback loop, and
the integrator outputs can respectively be connected by means of a controllable switch (25) to a signal input of an adder (27) which adds the output signals from the integrators in order to produce the filter output signal.

2. The sigma delta analog/digital converter according to claim 1, wherein the feedback switches (6a 3, 6b 3) have a respective signal amplifier (6a 4, 6b 4) with adjustable gain connected in series thereto which weights the respective feedback signal from the closed local feedback loop.

3. The sigma delta analog/digital converter according to claim 1, wherein the controllable switches (25) provided at the outputs of the integrators have respective signal amplifiers (26) with adjustable gain connected in series thereto which weights the output signal from the respective integrator.

4. The sigma delta analog/digital converter according to either of claims 2 and 3, wherein the signal amplifiers are voltage-controlled current sources.

5. The sigma delta analog/digital converter according to claim 1, wherein the integrators have a respective operational amplifier which is fed back via a capacitor.

6. The sigma delta analog/digital converter according to claim 5, wherein the capacitance of the capacitor is adjustable.

7. The sigma delta analog/digital converter according to claim 5, wherein the power supply for the operational amplifiers can respectively be disconnected by a controllable switch.

8. The sigma delta analog/digital converter according to claim 5, wherein the operational amplifiers are of fully differential design.

9. The sigma delta analog/digital converter according to claim 1, wherein the output side of the quantizer (10) is connected to the first digital/analog converter (16) via a first signal delay circuit (14).

10. The sigma delta analog/digital converter according to claim 9, wherein the output side of the quantizer (10) can be connected to a second digital/analog converter (22) by means of a controllable switch (19), and said second digital/analog converter is adapted to convert the digital output signal into a second analog feedback signal which is subtracted from the filter output signal from the analog loop filter (6) by means of a subtractor (8).

11. The sigma delta analog/digital converter according to claim 10, wherein the second digital/analog converter has a signal amplifier with adjustable gain connected upstream thereto.

12. The sigma delta analog/digital converter according to claim 11, wherein the signal amplifier (20) has a second signal delay circuit (18) provided in series therewith.

13. The sigma delta analog/digital converter according to claim 9, wherein the quantizer (10) has a digital decimation filter (13) connected downstream thereto.

14. The sigma delta analog/digital converter according to claim 3, wherein the controllable switches respectively have a control line, and these are connected to a programmable configuration memory (28).

15. The sigma delta analog/digital converter according to claim 14, wherein the signal gain of the signal amplifiers can respectively be set via a control line which is connected to the configuration memory (28).

16. The sigma delta analog/digital converter according to claim 15, wherein, for the purpose of setting the sigma delta analog/digital converter (1) to different xDSL standards, the configuration memory (28) is adapted to store a programmable configuration coefficient set for each xDSL standard.

17. The sigma delta analog/digital converter according to one of claims 14 to 16, wherein the configuration memory

(28) is adapted to take a standard selection signal as a basis for reading one of the stored configuration coefficient sets in order to control the controllable switches and in order to set the signal amplifiers.

18. The sigma delta analog/digital converter according to claim 16, wherein the capacitances of the capacitors provided in the integrators can be set on the basis of configuration coefficients from the configuration coefficient set which has been read.

19. The sigma delta analog/digital converter according to claim 16, wherein the signal delays from the two signal delay circuits (14, 18) can be set on the basis of configuration coefficients from the configuration coefficient set which has been read.

20. The sigma delta analog/digital converter according to claim 1, wherein the analog loop filter (6) has two resonator filter stages (6a, 6b).

21. The sigma delta analog/digital converter according to claim 1, further comprising a subtractor (4) that subtracts the feedback signal from the xDSL signal received in order to produce the difference signal.

22. The sigma delta analog/digital converter according to claim 1, wherein the xDSL signal is received via a telephone signal line.

23. The sigma delta analog/digital converter according to one of claims 1 and 13, wherein the quantizer (10), the two digital/analog converters (16, 22), and the decimation filter (13) are clocked with the same clock signal.

24. The sigma delta analog/digital converter according to claim 23, wherein the clock signal is produced by an integrated clock signal generator (30).

25. The sigma delta analog/digital converter according to claim 1, wherein the quantizer (10) has a plurality of comparators connected up in parallel thereto.

26. The sigma delta analog/digital converter according to one of claims 1 and 10, wherein the two digital/analog converters (16, 22) can respectively be activated by means of an external control signal (Enable).

27. The sigma delta analog/digital converter according to claim 1, wherein the first digital/analog converter is a current controlled digital/analog converter of fully differential design.

28. The sigma delta analog/digital converter according to claim 1, wherein the sigma delta analog/digital converter is integrated on a chip.

29. The sigma delta analog/digital converter according to claim 1, wherein the sigma delta analog/digital converter (1) has an analog input filter connected upstream thereto.

* * * * *